(12) United States Patent
Gordon

(10) Patent No.: US 6,258,157 B1
(45) Date of Patent: Jul. 10, 2001

(54) LIQUID PRECURSORS FOR FORMATION OF METAL OXIDES

(75) Inventor: Roy G. Gordon, Cambridge, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 0 days.

(21) Appl. No.: 09/392,845

(22) Filed: Sep. 9, 1999

Related U.S. Application Data

(62) Division of application No. 09/062,591, filed on Apr. 17, 1998, now Pat. No. 5,980,983.
(60) Provisional application No. 60/043,279, filed on Apr. 17, 1997.

(51) Int. Cl.[7] .............................. C09K 3/00; H01L 21/00; B05D 1/02; B05D 5/12
(52) U.S. Cl. ................................ 106/287.24; 106/287.17; 106/287.18; 106/287.19; 427/123; 427/126.3; 427/226; 427/421; 427/453; 556/40; 438/3; 438/240; 438/778; 438/782; 438/785
(58) Field of Search .................................. 427/226, 453, 427/123, 126.3, 421; 556/40; 106/287.17, 287.18, 287.19, 287.24; 438/3, 240, 778, 782, 785

(56) References Cited

U.S. PATENT DOCUMENTS

| | | | |
|---|---|---|---|
| 3,356,327 | * 12/1967 | Moshier et al. | 117/107.2 |
| 4,147,556 | * 4/1979 | Donley | 106/287.18 |
| 4,180,386 | * 12/1979 | McCormack et al. | 44/63 |
| 4,424,165 | 1/1984 | Thompson | 260/429.2 |
| 4,501,602 | 2/1985 | Miller et al. | 65/18.2 |
| 4,735,861 | * 4/1988 | Carlson | 428/432 |
| 5,041,417 | 8/1991 | Agostinelli et al. | 505/1 |
| 5,096,737 | 3/1992 | Baum et al. | 427/38 |
| 5,116,785 | * 5/1992 | Mackey et al. | 437/243 |
| 5,156,884 | * 10/1992 | Tanitsu et al. | 427/558 |
| 5,225,561 | 7/1993 | Kirlin et al. | 546/256 |
| 5,248,787 | * 9/1993 | Timmer et al. | 549/206 |
| 5,280,012 | 1/1994 | Kirlin et al. | 505/1 |
| 5,348,631 | 9/1994 | Desu et al. | 204/157 |
| 5,391,393 | * 2/1995 | Maniar | 427/100 |
| 5,394,269 | * 2/1995 | Takamatsu et al. | 359/580 |
| 5,407,603 | * 4/1995 | Morrison | 252/518 |
| 5,451,434 | 9/1995 | Doellein | 427/255.2 |
| 5,453,494 | 9/1995 | Kirlin et al. | 534/15 |
| 5,504,195 | 4/1996 | Leedham et al. | 534/15 |
| 5,518,536 | 5/1996 | Doellein | 106/1.25 |
| 5,629,229 | * 5/1997 | Si et al. | 438/3 |
| 5,793,600 | * 8/1998 | Fukuda et al. | 361/321.4 |
| 5,804,473 | * 9/1998 | Takizawa | 438/166 |
| 5,849,465 | * 12/1998 | Uchida et al. | 430/325 |
| 5,980,983 | * 11/1999 | Gordon | 427/226 |

FOREIGN PATENT DOCUMENTS

| | | |
|---|---|---|
| 0 527 661 | 2/1993 | (EP) . |
| 5-251940 | 10/1993 | (JP) . |
| 6-184749 | 7/1994 | (JP) . |
| 8-85873 | 4/1996 | (JP) . |
| 9-49081 | 2/1997 | (JP) . |

OTHER PUBLICATIONS

"A Review of Group 2 (Ca, Sr, Ba) Metal–Organic Compounds as Precursors for Chemical Vapor Deposition" *Adv. Organomet. Chem.* 40:215–334 (1996).

"Diketones and Related Ligands" *Comprehensive Coordination Chemistry*, Eds. G. Wilkinson, R.D. Gillard and J.A. McCleverty, vol. 2, Chapter 15.4, Pergamon Press, Oxford, pp. 365–412 (1987) No Month Provided.

"Synergism in the Exraction of Uranium (VI) by a Mixture of Oxine and β–Diketones" *Chem. Abst.* 103:93770j (Sep. 23, 1985).

"Extractions of Several Rare Earths Using a Combination of Thenoyltrifluoroacetone and Acetylacetone" *Chem. Abst.* 71:33898t (Aug. 25, 1969).

* cited by examiner

*Primary Examiner*—David Brunsman
(74) *Attorney, Agent, or Firm*—Clark & Elbing LLP; Mary Rose Scozzafava

(57) ABSTRACT

A liquid precursor is provided for the formation of metal oxide films comprising a mixture of two or more types of beta-diketonate ligands bound to one or more metals. A metal beta-diketonate compound having at least two different beta-diketonate ligands provided. For example, a liquid mixture was formed of the mixed aluminum beta-diketonates derived from two or more of the ligands 2,6-dimethyl-3,5-heptanedione; 2,7-dimethyl-3,5-heptanedione; 2,6-dimethyl-3,5-octanedione; 2,2,6-trimethyl-3,5-heptanedione; 2,8-dimethyl-4,6-nonanedione; 2,7-dimethyl-4,6-nonanedione; 2,2,7-trimethyl-3,5-octanedione; and 2,2,6-trimethyl-3,5-octanedione. Films of metal oxides are deposited from vaporized precursor mixtures of metal beta-diketonates and, optionally, oxygen or other sources of oxygen. This process may be used to deposit high-purity, transparent metal oxide films on a substrate. The liquid mixtures may also be used for spray coating, spin coating and sol-gel deposition of materials.

27 Claims, No Drawings

LIQUID PRECURSORS FOR FORMATION OF METAL OXIDES

CROSS REFERENCE TO RELATED APPLICATIONS

This application is a divisional of and claims priority from U.S. patent application Ser. No. 09/062,591, filed Apr. 17, 1998, now U.S. Pat. No. 5,980,983, which claims priority from provisional patent application No. 60/043,279 filed Apr. 17, 1997.

This invention was made with the support of the United States government under National Science Foundation Grant No. NSF CHE-95-10245. The United States may have certain rights in the invention.

BACKGROUND OF THE INVENTION

1. Field of the Invention

This invention relates to novel volatile liquid reagents which can replace less satisfactory solid sources in film deposition processes such as chemical vapor deposition (CVD), spray coating, spin coating or sol-gel deposition. These liquid reagents can be used for deposition of metals or metal-containing materials, such as metal oxides.

2. Description of the Related Art

Chemical vapor deposition (CVD) is a widely-used process for forming solid materials, such as coatings or powders, from reactants in the vapor phase. Comprehensive reviews of CVD processes have been given recently in "CVD of Nonmetals," W. S. Rees, Jr., Editor, VCH Publishers, Weinheim, Germany, 1996; "CVD of Compound Semiconductors," A. C. Jones and P. O'Brien, VCH, 1996; and "The Chemistry of Metal CVD," T. Kodas and M. Hampden-Smith, Editors, VCH, 1994.

In CVD processes, a reactant vapor may be created by heating a liquid to a sufficiently high temperature and bubbling a flow of a carrier gas through the liquid, to transport the vapor into the CVD chamber. In a low-pressure CVD system, the carrier gas may be omitted, and the vapor may flow directly from the bubbler into the low-pressure CVD chamber.

In order for a CVD process to function successfully, it is necessary to create a vapor containing controlled amounts of suitably reactive chemicals. Solids can be used as sources of vapor in CVD processes. However, when solids are used in a bubbler, the rate of vapor production by sublimation of a solid is not easily reproducible, because the amount of vapor produced often depends on the particle size and shape, which change as the sublimation process continues. Thus the vapor concentration can change in an uncontrolled way, thereby changing the growth rate and/or the composition of materials made by the CVD process. Also, different batches of solid may have different sizes and shapes of particles, so that the results of a CVD process may change when a new batch of solid precursor is placed in the system. These difficulties are particularly evident in the currently-used CVD precursors for barium, strontium and calcium, which are reviewed by W. A. Wojtczak, P. F. Fleig and M. J. Hampden-Smith, in *Advances in Organometallic Chemistry*, vol. 40, pp. 215–340 (1996).

Another problem with solids is that their rate of sublimation can be altered by small amounts of contamination on their surfaces. In contrast, liquid surfaces tend to be refreshed by motion of the liquid, so that they tend to evaporate at a reproducible rate even in the presence of small amounts of contaminants.

Some solid materials show different vapor pressures, depending on the history of how the particular sample was prepared. For example, aluminum isopropoxide has been used to deposit aluminum oxide films, for example by J. A. Aboaf in the *Journal of the Electrochemical Society*, vol. 114, pp. 948–952 (1967). Solid aluminum isopropoxide exists in a number of isomeric forms, ranging from dimers to trimers to tetramers to polymers of various lengths. The rates of interconversion between isomeric forms are slow, often taking days. The vapor pressures of these isomers vary widely. Thus it is very difficult to regulate or predict the vapor pressure of any particular sample of aluminum isopropoxide, and the deposition rate of aluminum oxide from this solid source is not reproducible. In comparison, liquids usually exist in only one reproducible form at any given temperature and pressure.

Another difficulty with solids is that rates of sublimation are often low, so that sufficiently high vapor concentrations cannot be produced. For example, aluminum 2-ethylhexanoate has been proposed as a source for CVD of aluminum oxide, by T. Maruyama and T. Nakai in *Applied Physics Letters*, vol.58, pp.2079–2080 (1991). This solid source material has a very low vapor pressure, which limits the deposition rate to very low values. In comparison, liquids often have higher vapor pressures than solids.

Another practical difficulty with solids is that transferring them between containers is less convenient than pumping liquids.

Thermal decomposition of solids is another problem that often affects the reproducibility of solid vapor sources. For example, the solid beta-diketonates of barium and strontium gradually decompose at their vaporization temperatures, so that the amount of vapor generated decreases with time. Thermal decomposition is also a potential problem for liquid sources, but its effect may be minimized for liquids by rapid or "flash" vaporization. This can be accomplished by pumping the liquid at a steady, controlled rate into a hot region in which the liquid vaporizes quickly. In such a "direct liquid injection" (DLI) system, each part of the liquid is heated for only a short time, and its vapor can be formed without significant decomposition even from thermally sensitive liquids. Another advantage of a DLI system is that multi-component mixtures can be vaporized in a fixed and reproducible ratio, even if the components differ in volatility. Because of these advantages, DLI systems are becoming more widely used in CVD processes.

Solid sources can be used in DLI vapor sources if a suitable liquid solvent can be found to dissolve the solid. However, solvents can introduce other difficulties, such as increased flammability, toxicity or corrosiveness, and an increased volume of gaseous byproducts must be removed from the exhaust gases to avoid pollution. These difficulties with a solvent can be minimized if the solid is highly soluble in the solvent, so that only a small amount of solvent is needed to form the liquid solution.

Because of all these difficulties, solid sources of vapor are seldom used in commercial CVD processes. Either liquids, or solids that are highly soluble in a liquid solvent, are more convenient, and more commonly used in the practice of CVD. Creating this vapor from a liquid source would be much more reproducible and convenient than creating it from a solid source; however, there are few practical compounds which may be used for this purpose.

Beta-diketonates are one class of solid compounds that can be formed from almost every metal. Beta-diketonates are known for zinc, cadmium, mercury, aluminum, gallium, indium, thallium, tin, lead, antimony, bismuth, lithium, sodium, potassium, rubidium, cesium, beryllium, magnesium, calcium, strontium, barium, scandium, yttrium, lanthanum, titanium, zirconium, hafnium, vanadium, niobium, tantalum, chromium, molybdenum, tungsten, manganese, technetium, rhenium, iron, ruthenium, osmium, cobalt, rhodium, iridium, nickel, palladium, platinum, copper, silver, cerium, the other rare earth metals and the actinide metals. A thorough review of beta-diketonate compounds was written by A. R. Siedle, in "Comprehensive Coordination Chemistry" (Pergamon Press, Oxford, 1987, vol. 2 chapter 15.4). Almost all of the known beta-diketonate compounds are solids at room temperature, and thus are not very convenient for use as vapor sources for CVD processes.

The vapor pressures of some of the solid beta-diketonates are low, even at temperatures high enough to cause their thermal decomposition. This problem is acute for the beta-diketonates of alkaline earth metals. Their vapor pressures may be increased by vaporizing them in the presence of amines (R. G. Gordon et al., U.S. Pat. No. 5,139,999, 1992), ethers (Miller et al., U.S. Pat. No. 4,501,602, 1985; Timmer et al., U.S. Pat. No. 5,248,787, 1993; Kirlin et al., U.S. Pat. No. 5,280,012, 1994) orthoethers (Kirlin et al., U.S. Pat. No. 5,225,561, 1993). However, even when bound to these Lewis bases, the beta-diketonates disclosed in these references are still solids at room temperature.

SUMMARY OF THE INVENTION

A principal object of the present invention to provide chemical precursors that are liquids at room temperature, or that are solids highly soluble in solvents, for the deposition of metal-containing materials.

An additional object of the present invention is to provide chemical precursors that are easily vaporized without decomposition, and that do not leave a nonvolatile residue for the deposition of metal-containing materials.

A related object of the present invention is the deposition of metal-containing materials from chemical precursors that are liquids at room temperature, or that are solids highly soluble in solvents.

Another related object is to deposit materials containing several metals by a chemical vapor deposition process in which all the reactants may be mixed homogeneously before delivery to the heated surface of the substrate.

An additional object of the present invention is the deposition of metal-containing materials from chemical precursors that are easily vaporized without decomposition, and that do not leave a nonvolatile residue.

Another object of the present invention is to provide a process for making metal oxides having high purity.

Another object of the present invention is the deposition of metal oxide films from chemical precursors that are not pyrophoric.

A further object of the present invention is to deposit metal oxides from a robust chemical vapor deposition process which is not easily disrupted by leaks of air into the deposition region.

Another object of the invention is to provide a chemical vapor deposition process for metal oxides from reactants that are stable and relatively nonhazardous.

Another object of the invention is to provide a chemical vapor or solution deposition process for complex metal oxides in which the precursor metal-containing compounds are stable and homogeneous.

A further object of the invention is to provide liquid mixtures or solutions suitable for spray coating, spin coating or sol-gel deposition.

One particular object of the present invention is to provide a process for depositing aluminum oxide having high purity, high electrical resistivity and high transparency to light.

Another particular object of the present invention is to provide a process for depositing zirconium oxide having high purity, high electrical resistivity and high transparency to light.

A further particular object of the present invention is to provide a process for depositing zinc oxide having high purity, high electrical conductivity and high transparency to light.

Another particular object of the present invention is to provide a process for depositing barium ferrites having useful magnetic properties.

Another particular object of the present invention is to provide a process for depositing barium titanate having good ferroelectric properties.

Another particular object of the present invention is to provide a process for depositing strontium bismuth tantalate films having good ferroelectric properties.

Another particular object of the present invention is to provide a process for depositing barium-strontium titanate coatings having a high dielectric constant and a high electrical resistance.

Another particular object of the present invention is to provide a process for depositing a mixture of the oxides of iron, cobalt and chromium having low transparency to light.

Other objects of the invention will be obvious to those skilled in the art on reading the instant invention.

The above objects have been substantially achieved by use of a composition comprising a metal beta-diketonate having two or more types of beta-diketonate ligands bound to the metal. In preferred embodiments, the composition may be a mixture of metal beta-diketonate compounds in which at least one compound is a metal beta-diketonate having two or more types of beta-diketonate ligands bound to the metal. The mixture may further comprise metal beta-diketonate compounds having the same beta-diketonate ligand bound to the metal. The metal beta-diketonate mixture may further contain two or more metal-types.

In a preferred embodiment, the beta-diketonate has the formula, $R^1C(=O)CHR^3C(=O)R^2$, where $R^1$ and $R^2$ may be an alkyl group, a fluoroalkyl group or an alkyl group containing oxygen- or nitrogen-containing species (for example, an amino, alcohol or alkoxyl species). $R^3$ may be an alkyl group, a fluoroalkyl group or an alkyl group containing oxygen- or nitrogen-containing species or H. In preferred embodiments, the alkyl group contains less than ten carbons and preferably less than seven carbons. One preferred composition of the metal diketonates includes two or more ligands derived from 2,6-dimethyl-3,5-heptanedione; 2,7-dimethyl-3,5-heptanedione; 2,6-dimethyl-3,5-octanedione; 2,2,6-trimethyl-3,5-heptanedione; 2,8-dimethyl-4,6-nonanedione; 2,7-dimethyl-4,6-nonanedione; 2,2,7-trimethyl-3,5-octanedione, and 2,2,6-trimethyl-3,5-octanedione.

In preferred embodiments, the mixture of metal beta-diketonates is a liquid. It is believed that the use of a mixture in which a portion of the metal beta-diketonate compounds contain two or more different types of beta-diketonate ligands promotes the formation of the liquid phase.

In another embodiment of the invention, the mixture of metal beta-diketonates is a solid which is highly soluble in organic solvents. The metal beta-diketonate mixture may preferably be prepared in concentrations of greater than 0.1

M, more preferably greater than 0.5 M and most preferably greater than 1.0 M.

In some cases, only two different beta-diketonate ligands may be sufficient to achieve the properties cited above. In other cases, three or four or even more different ligands may be desired. Some embodiments may include six or more beta-diketonate ligands.

In another aspect of the invention, a process for the chemical vapor deposition of metal oxides from vapors of a mixture of metal beta-diketonates and, optionally, another oxygen-containing gas, is provided. The process may be used to form metal oxide films, including, but not limited to, aluminum oxide, zirconium oxide and zinc oxide. A preferred embodiment uses a homogeneous vapor mixture comprising these ligands chelated to one or more metals, oxygen and, optionally, an inert carrier gas such as nitrogen. This vapor mixture is brought into contact with a substrate heated to a temperature sufficient to-deposit a metal oxide. Typical deposition temperatures lie in the range of about 200 to 800° C. Typical deposition pressures range from normal atmospheric pressure down to a few milli-Torr.

Another preferred embodiment uses a homogeneous liquid mixture of metal compounds having the metals bound to two or more beta-diketonates, and optionally, a solvent. This liquid mixture is vaporized to form a vapor mixture and, optionally mixed with an oxygen-containing gas, such as air, and an inert carrier gas such as nitrogen. This vapor mixture is heated to a temperature in sufficient to cause reaction and the formation of a material comprising one or more metal oxides. Alternatively, reaction may be caused by light, or by the electrical energy of a plasma discharge.

In another embodiment of the invention, multimetal oxides are formed from mixtures of metal beta-diketones, in which the metal beta-diketonate mixture contains two or more metals, in deposition processes as described herein. The process may be used to form multimetal oxide films, including, but not limited to, barium ferrites, barium titanate, strontium bismuth tantalate and barium strontium titanate.

DETAILED DESCRIPTION OF THE INVENTION

The required beta-diketone ligands may be prepared by known methods, such as the Claisen condensation of a methyl ketone and an ethyl ester, in the presence of a strong base, such as sodium hydride. Detailed description of this procedure is given in *Inorganic Syntheses*, Vol. 23, pp. 144–145 (1985). The individual beta-diketones may be prepared separately and then mixed before combining them with the metal. A quicker procedure is to condense simultaneously a mixture of methyl ketones, such as tert-butyl methyl ketone, sec-butyl methyl ketone, isobutyl methyl ketone and methyl isopropyl ketone, along with a mixture of ethyl esters, such as ethyl isobutyrate, ethyl isovalerate, ethyl 2-methylbutyrate and ethyl trimethylacetate. By proton-decoupled carbon-13 NMR analysis in deuterochloroform, the resulting reaction product was found to be a mixture containing ten of the preferred beta-diketone ligands. Table 1 gives the chemical shifts of the central carbon between the ketone groups, in the major (enol) forms of these ten compounds (the first 10 of Table 1) and some similar compounds. This single resonance line is easily resolved for each compound in this mixture, making it useful for analysis, whereas other lines in the proton and C-13 NMR spectra are badly overlapped. Table 1 also gives the numbers assigned by Chemical Abstracts to the previously reported compounds. The general formula is written $R^1C(=O)CHR^3C(=O)R^2$, where $R^3=H$ in all these examples, where $R^1$ and $R^2$ may be an alkyl group, a fluoroalkyl group or an alkyl group containing oxygen- or nitrogen-containing species (for example, an amino, alcohol or alkoxyl species). $R^3$ may be an alkyl group, a fluoroalkyl group or an alkyl group containing oxygen- or nitrogen-containing species or H. In preferred embodiments, the alkyl group contains less than ten carbons and preferably less than seven carbons.

TABLE 1

Some beta-diketones

| Name | $R^1$ | $R^2$ | Chemical Shift C-13 NMR, ppm | Chemical Abstracts No. |
|---|---|---|---|---|
| 2,6-dimethyl-3,5-heptanedione | iso-Pr | iso-Pr | 94.9 | 57733-60-5 |
| 2,7-dimethyl-3,5-octanedione | iso-Pr | iso-Bu | 97.8 | 7307-07-5 |
| 2,6-dimethyl-3,5-octanedione | iso-Pr | sec-Bu | 96.0 | not reported |
| 2,2,6-trimethyl-3,5-heptanedione | iso-Pr | tert-Bu | 92.9 | 7333-23-5 |
| 2,8-dimethyl-4,6-nonanedione | iso-Bu | iso-Bu | 100.6 | 7307-08-6 |
| 2,7-dimethyl-4,6-nonanedione | iso-Bu | sec-Bu | 98.8 | not reported |
| 2,2,7-trimethyl-3,5-octanedione | iso-Bu | tert-Bu | 95.7 | 69725-37-7 |
| 3,7-dimethyl-4,6-nonanedione | sec-Bu | sec-Bu | 97.0 | 43865-74-2 |
| 2,2,6-trimethyl-3,5-octanedione | sec-Bu | tert-Bu | 94.0 | 34865-71-9 |
| 2,2,6,6-tetramethyl-3,5-heptanedione | tert-Bu | tert-Bu | 90.6 | 1118-71-4 |
| 2,2,6,6-tetramethyl-3,5-octanedione | tert-Bu | $^t$pentyl | 91.7 | 78579-61-0 |
| 6-ethyl-2,2-dimethyl-3,5-octanedione | tert-Bu | 3-pentyl | 95.4 | 188530-39-4 |
| 2,2,6-trimethyl-3,5-nonanedione | tert-Bu | 2-pentyl | 93.9 | not reported |
| 6-ethyl-2,2-dimethyl-3,5-decanedione | tert-Bu | 3-heptyl | 95.3 | not reported |
| 3,3,7,7-tetramethyl-4,6-nonanedione | $^t$pentyl | $^t$pentyl | | 138024-17-6 |

Compounds can be formed between these ligands and most metals. One ligand can be bound to metal ions in oxidation state +1, such as copper, silver, thallium, lithium and sodium. Two ligands can be bound to metal ions in oxidation state +2, including copper, zinc, cadmium, mercury, tin, lead, beryllium, magnesium, calcium, strontium, barium, manganese, iron, cobalt, nickel, palladium and platinum. Three ligands can be bound to metals in oxidation state +3, including aluminum, gallium, indium, thallium, bismuth, titanium, vanadium, chromium, molybdenum, manganese, iron, ruthenium, cobalt, rhodium, iridium, scandium, yttrium, lanthanum, cerium, and the other rare earth metals. Four ligands can be bound to large metals in oxidation state +4, including titanium, zirconium, hafnium, niobium, cerium, thorium and uranium. Many different reactions can be used to bind beta-diketonate ligands to metals. Specific examples of preparative procedures are given in Inorganic Syntheses, for chromium(III) in Vol. 5, pp. 130–131 (1957) and Vol. 24, pp. 183–184 (1986); for cobalt(III) in Vol. 5, pp. 188–189 (1957); for rare earth metals in Vol. 11, pp. (1094–98 (1968); for cerium(IV) in Vol. 12, pp. 77–78 (1970) and Vol. 23, pp. 147–8 (1985); for manganese(III) in Vol. 23, pp. 148–149 (1985); for iron(11) in Vol. 31, pp. 267–269 (1997); for copper(II) in Vol. 23, pp. 146–147 (1985); for beryllium in Vol. 2, pp. 17–20 (1946);

and for calcium, strontium and barium in Vol. 31, pp. 1–7 (1997). The distribution of metal beta-diketonates will depend on the number and relative amounts of beta-diketonate types used in the preparation of the metal compounds.

Additional ligands, besides the beta-diketonate mixtures, may be advantageously bound to the metal. For example, the barium, strontium or calcium mixed beta-diketonates may be complexed with donor solvents, such as ethers or amines. Metals in higher oxidation states, such as titanium(IV) or tantalum(V), may contain monodentate ligands, such as alkoxides or halides, in addition to the mixed beta-diketonate ligands.

Some or all of the oxygens in the beta-diketonate ligands may be replaced by isoelectronic species, such as sulfur or NH or NR, where R is a hydrocarbon radical. Ligands with these sulfur or nitrogen replacements are particularly useful in binding heavy metals, such as platinum or mercury. For the purposes of this specification and claims, these isoelectronically substituted beta-diketonate ligands shall be considered as beta-diketonates.

Some or all of the hydrogens in the beta-diketonate ligands may be replaced by fluorine. Fluorine substitution may be used to deposit fluorides instead of oxides. Fluorine substitution may also provide higher vapor pressures of the precursor compounds.

The novel metal beta-diketonate mixtures of this invention are generally liquids or highly soluble glasses at room temperature. The vapor of these liquid mixtures may be formed in a thin-film evaporator, or by nebulization into a carrier gas preheated to about 150 to 250° C. The nebulization may be carried out pneumatically or ultrasonically. Alternatively, the mixture may be dissolved in a solvent and the liquid solution vaporized using a thin film evaporator or nebulization. The liquid metal beta-diketonate mixtures are generally completely miscible with organic solvents, including hydrocarbons, such as dodecane, tetradecane, and xylene, and with alcohols, ethers, esters, ketones and chlorinated hydrocarbons. The solid glassy metal beta-diketonate mixtures are generally highly soluble in organic solvents.

The process of the invention can be carried out in standard equipment well known in the art of chemical vapor deposition. The apparatus brings the vapors of the reactants into contact with a heated substrate on which the metal oxide deposits. The process can operate at a variety of pressures, including in particular normal atmospheric pressure, and also lower pressures. Commercial atmospheric pressure CVD furnaces are made in the USA by the Watkins-Johnson Company (Scotts Valley, Calif.), BTU International (North Billerica, Massachusetts) and SierraTherm (Watsonville, Calif.). Commercial atmospheric pressure CVD equipment for coating glass on the float production line is made in the USA by the Libbey-Owens-Ford Company (Toledo, Ohio), PPG Industries (Pittsburgh, Pa.) and AFG Industries (Kingsport, Tenn.). Low-pressure CVD equipment is made by Applied Materials (Santa Clara, Calif.), Spire Corporation (Bedford, Mass.), Materials Research Corporation (Gilbert, Ariz.), Novellus (San Jose, Calif.) and Emcore Corporation (Somerset, N.J.).

The liquid or solid reactants may be vaporized by well-known methods, including passing a carrier gas through a heated liquid or powdered solid in a bubbler, or injecting or spraying a liquid or a solution into a flow of heated carrier gas. Commercial equipment for direct vaporization of liquids (DLI) is made by MKS Instrunents (Andover, Mass.), ATMI (Danbury, Conn.), Novellus (San Jose, Calif.) and COVA Technologies (Tiburton, Calif.). Thin-film evaporators are made by Artisan Industries (Waltham, Mass.).

The liquids and solutions described herein may also be used as metal-containing precursors for other types of deposition processes, such as spray coating, spin coating or sol-gel formation of mixed metal oxides. The high solubility and miscibility of these precursors is an advantage in forming the required solutions. The fact that a common set of ligands may be used with a wide variety of metals, means that solutions of different metal precursors may be mixed with little chance for undesired precipitation of insoluble byproducts.

All experimental manipulations were carried out using standard Schlenk techniques under dry nitrogen either in a glovebox or on a Schlenk line unless otherwise stated.

EXAMPLE 1

A mixture of beta-diketones was first prepared by condensing a mixture of ethyl esters and methyl ketones with sodium hydride as a strong base. 350 ml of toluene was dried by distillation from sodium, and placed in a 1-liter flask with three necks. 1.4 moles of NaH (59 g of 60 weight % dispersion in mineral oil) was added to the toluene. To this mixture was added 20.33 g (0.175 mol) of ethyl isobutyrate, 22.78 g (0.175 mol) of ethyl isovalerate, and 45.57 g (0.35 mol) of ethyl 2-methyl butyrate. This mixture was stirred rapidly and heated in a water bath to nearly 100° C. Dry nitrogen was passed slowly into the flask from one of the three necks. A water-cooled reflux condenser was placed in a second of the three necks. A pressure-equalized dropping funnel was placed in the third neck. In the dropping funnel was placed 23.37 g (0.23 mol) of methyl tert-butyl ketone, 20.10 g (0.23 mol) of methyl iso-propyl ketone and 23.37 g (0.23 mol) of methyl iso-butyl ketone. The ketone mixture was added slowly (dropwise) with vigorous stirring, over a period of three hours. Heating was continued for 30 minutes, and then the mixture was allowed to cool to room temperature, and the stirring was continued overnight. Then the mixture was then cooled in an ice-bath and neutralized by slow addition of 6M hydrochloric acid (about 300 ml). (Caution, flammable hydrogen gas is evolved.) The mixture was filtered to remove suspended solids, which were discarded. The mixture was put in a separatory funnel, and the organic layer isolated. The toluene was removed in a rotary evaporator. The crude beta-diketonates were then dried with magnesium sulfate and distilled under reduced pressure, to separate them from the mineral oil and other high-boiling impurities. 93.16 g (60% yield) of a light yellow liquid was obtained.

This beta-diketonate mixture was analyzed by carbon-13 NMR. It contained the expected eight compounds, 2,6-dimethyl-3,5-heptanedione; 2,7-dimethyl-3,5-heptanedione; 2,6-dimethyl-3,5-octanedione; 2,2,6-trimethyl-3,5-heptanedione; 2,8-dimethyl-4,6-nonanedione; 2,7-dimethyl-4,6-nonanedione; 2,2,7-trimethyl-3,5-octanedione, and 2,2,6-trimethyl-3,5-octanedione. The carbon-i 3 resonances were identified by separate syntheses of each of the pure components by analogous methods. The best-isolated resonance peaks were from the carbon between the ketone groups, in the enol form, which is the major isomer of these compounds.

The beta-diketones in this mixture were attached to aluminum by reaction with triethylaluminum. 5.25 g (0.03 mol) of the beta-diketone mixture was dissolved in 15 ml of dry benzene, in a magnetically-stirred Schlenk flask that was cooled in an ice-bath. 1.14 g (0.01 mol) of triethylaluminum was dissolved in 25 ml of dry benzene, and added dropwise over 1 hour to the cooled solution of beta-diketonates. Ethane gas was evolved during the addition, and passed out of a protective oil bubbler attached to the Schlenk flask. The reaction mixture remained clear until about 85% of the triethylaluminum had been added, after which some white solid precipitate gradually formed. The solution was filtered to remove the undesired solid precipitate. The liquid solution was placed under vacuum and heated to remove the benzene solvent and excess beta-diketone. The product was 4.4 g (80% yield) of a pale yellow liquid aluminum beta-diketonate mixture.

This aluminum beta-diketonate mixture was vaporized by pumping the liquid at a rate of 0.05 milliliters per minute into a pneumatic nebulizer together with a flow of 8 liters per minute of dry nitrogen gas preheated to a temperature of 180° C. A separate gas mixture was formed by the flow of 1 liter per minute of dry oxygen and 2 liters per minute of dry nitrogen. These two vapor mixtures were combined at a tee joint, from which they flowed through a line heated to 180° C. into the entrance to an atmospheric pressure CVD chamber measuring 10 cm wide by 0.6 cm high by 10 cm long (in the direction of the gas flow). A glass substrate rested on the bottom of the CVD chamber, which is heated from below, so that the glass plate was held at a temperature of about 450° C., while the top plate of the CVD chamber was at about 250° C. Prior to the deposition and while the glass plate was heating up, dry nitrogen passed through the chamber. Valves then switched on the flows of aluminum diketonate mixture and oxygen through the chamber for one minute, during which a layer of aluminum oxide was deposited.

On the surface of the glass plate there was a transparent film. The film was determined to be aluminum oxide, $Al_2O_3$, by Rutherford Backscattering Analysis (RBS) and X-ray Photoelectron Spectroscopy (XPS). Its structure is amorphous by X-ray diffraction. The film has a refractive index of about 1.6, a dielectric constant of about 6 to 8, and a very high electrical resistance. The absorption of visible light by the film is less than 0.1 percent. It is a good barrier to the diffusion of most materials, including sodium ions and water.

EXAMPLE 2

A zinc beta-diketonate mixture was formed by reaction of the beta-diketone mixture made in Example 1 with zinc acetate. 10.5 g (0.057 mol) of anhydrous zinc acetate and 25 ml of anhydrous ethanol were placed in a 100 ml glass flask fitted with a reflux condenser, heated to reflux, and magnetically stirred. 25 g (0.144 mol) of the beta-diketone mixture was added to the solution, and refluxing was continued for 2 hours. The pressure was reduced in order to distill out the ethanol, acetic acid byproduct and excess beta-diketone mixture. 18.7 g (80% yield, based on the zinc acetate) of a very viscous yellow liquid zinc beta-diketonate mixture remained.

The zinc beta-diketonate mixture was dissolved in an equal weight of mesitylene, and this solution was pumped into a CVD reactor as described in Example 1. A transparent, electrically conductive coating of was formed. The film was determined to be zinc oxide, ZnO, by RBS and XPS. It is crystalline by X-ray diffraction. Its refractive index was measured to be about 1.9.

EXAMPLE 3

A barium beta-diketonate mixture was formed by reaction of barium hydride with the beta-diketone mixture made as in Example 1. 1.81 g (0.013 mol) of barium hydride was suspended in a solvent mixture containing 2.89 g (0.013 mol) of tetraglyme and 25 ml of hexane in a 100 ml glass flask, magnetically stirred and cooled in an ice bath. 4.55 g (0.026 mol) of the beta-diketone mixture was added dropwise to the suspension over a period of 1 hour. Hydrogen gas was evolved during the addition. The resulting slightly turbid mixture was filtered to remove the small amount of solid contaminant (probably traces of barium oxide or barium hydroxide impurity in the barium hydride). The pressure was reduced, and the hexane distilled out. There remained 9 g of a yellow liquid containing a mixture of barium beta-diketonates.

This liquid barium beta-diketonate mixture was mixed with twice its weight of dry liquid dodecane. The purpose of the added dodecane solvent is to reduce the viscosity of the mixture, so that it can be vaporized more efficiently in an ultrasonic nebulizer. This dodecane solution was pumped at a 0.25 cc/min liquid flow rate into an ultrasonic nebulizer, through which nitrogen gas at 80 Torr pressure and 400 standard cc/min was passed. The resulting fog was mixed with a dry air flowing at 200 standard cc/min, and this combined mixture flowed at a pressure of 80 Torr into a tubular reactor (25 mm inside diameter) heated inside a tube furnace at 450° C. A transparent coating was formed on glass and silicon substrates in the tube furnace, as well as on the inside wall of the tube. The film was determined to be barium carbonate, $BaCO_3$, by RBS and XPS. Its refractive index was 1.6.

EXAMPLE 4

Example 3 was repeated with strontium hydride in place of the barium hydride. Similar results were obtained.

EXAMPLE 5

Example 3 was repeated with calcium hydride in place of the barium hydride Similar results were obtained.

EXAMPLE 6

Titanium bis(isopropoxide) bis(mixed beta-diketonates) was formed by reaction of titanium isopropoxide with a mixture of beta-diketones. 14.2 g (0.05 mol) of titanium isopropoxide was placed in a 100 ml glass reaction flak, magnetically stir-red and cooled in an ice-bath. 17.5 g (0.1 mol) of the beta-diketone mixture prepared as in Example 1 was added slowly over a period of 1 hour. The reaction mixture turned dark yellow and then yellow-brown while remaining clear and non-turbid. The reaction mixture was allowed to warm to room temperature, the pressure was reduced, and byproduct isopropanol was distilled out of the mixture. 26 g of a liquid titanium bis(isopropoxide) bis (mixed beta-diketonates) product was recovered.

The liquid titanium bis(isopropoxide) bis(mixed beta-diketonates) was pumped at a 0.10 cc/min liquid flow rate into an ultrasonic nebulizer, through which nitrogen gas at 80 Torr pressure and 400 standard cc/min was passed. The resulting fog was mixed with a dry air flowing at 200 standard cc/min, and this combined mixture flowed at a pressure of 80 Torr into a tubular reactor (25 mm inside diameter) heated inside a tube furnace at 450° C. A transparent coating was formed on glass and silicon substrates in the tube furnace, as well as on the inside wall of the tube. The film was determined to be titanium dioxide by RBS. The refractive index of the film was measured by ellipsometer to be 2.2.

EXAMPLE 7

Mixed beta-diketonates of titanium were formed by reaction of titanium isopropoxide with a mixture of beta-diketones. 14.2 g (0.05 mol) of titanium isopropoxide was placed in a 100 ml glass reaction flask, magnetically stirred and cooled in an ice-bath. 35 g (0.2 mol) of the beta-diketone mixture prepared as in Example 1 was added slowly over a period of 1 hour. The reaction mixture turned dark yellow and then brown while remaining clear and non-turbid. The reaction mixture was allowed to warm to room temperature, the pressure was reduced, and byproduct isopropanol was distilled out of the mixture. 36 g of a titanium (mixed beta-diketonates) product was recovered. The exact stoichiometry of this product is unknown, because some unreacted beta-diketones remained along with some bound isopropoxy groups.

The liquid titanium (mixed beta-diketonates) was used in a CVD experiment similar to that of Example 6, and similar results were obtained.

EXAMPLE 8

Zirconium tetra(mixed beta-diketonates) was formed by reaction of zirconium tetra(2,4-pentanedionate) with a mixture of beta-diketones. 8.22 g (0.0169 mol) of zirconium tetra(2,4-pentanedionate) was placed in a 100 ml glass reaction flask. 11.83 g (0.0676 mol) of the beta-diketone mixture prepared as in Example 1 was added, and the mixture was magnetically stirred and heated to 135° C. for 1 hour. During this time, the solid zirconium tetra(2,4-pentanedionate) dissolved to give a clear yellow solution. The pressure was reduced, and byproduct 2,4-pentanedione was distilled out of the mixture. 11 g (85% yield) of the viscous liquid zirconium tetra(mixed beta-diketonates) product was recovered. The liquid is air-stable and miscible with organic solvents.

The liquid zirconium tetra(mixed beta-diketonates) was used as a precursor in a CVD experiment similar to that described in Example 1. The deposited film was determined to be zirconium dioxide, $ZrO_2$, by RBS. The refractive index of the transparent film was measured by ellipsometer to be 2.0.

EXAMPLE 9

Tantalum (mixed beta-diketonate) tetra(ethoxide) was formed by reaction of tantalum ethoxide with a mixture of beta-diketones. 8.397 g (0.02067 mol) of tantalum(V) ethoxide was placed in a glass flask, magnetically stirred and cooled in an ice-bath. 3.61 g (0.0206 mol) of the beta-diketone mixture prepared as in Example 1 was added. The reaction mixture was stirred and heated to 65° C. for 2 hours. Then the pressure was reduced and byproduct isopropanol was distilled out of the mixture. 9.37 g (84% yield) of clear, light yellow, low-viscosity liquid tantalum (mixed beta-diketonates) tetra(ethoxide) product was recovered.

The liquid tantalum (mixed beta-diketonates) tetra (ethoxide) was pumped at a 0.10 cc/min liquid flow rate into an ultrasonic nebulizer, through which nitrogen gas at 80 Torr pressure and 400 standard cc/min was passed. The resulting fog was mixed with a dry air flowing at 200 standard cc/min, and this combined mixture flowed at a pressure of 80 Torr into a tubular reactor (25 mm inside diameter) heated inside a tube furnace at 400° C. A transparent, electrically insulating coating was formed on glass and silicon substrates in the tube furnace, as well as on the inside walls of the tube. The film was determined by RBS to be tantalum(V) oxide, $Ta_2O_5$ containing some excess oxygen or hydroxide and no detectable carbon. The refractive index of the film was measured by ellipsometer to be 2.2.

COMPARATIVE EXAMPLE 10

Example 9 was repeated with 2,4-pentanedione in place of the mixture of beta-diketonates. A solid material, tantalum (2,4-pentanedionate) tetra(ethoxide), was found instead of the liquid tantalum (mixed beta-diketonates) tetra(ethoxide).

EXAMPLE 11

Mixed beta-diketonates of magnesium were formed by reaction of magnesium ethoxide with a mixture of beta-diketones. 5.72 g (0.05 mol) of magnesium ethoxide was added to 25 ml of tetraglyme. 17.5 g (0.1 mol) of the beta-diketone mixture prepared in Example 1 was added, and the mixture was magnetically stirred and heated to 80° C. for 1 hour. During this time, the solid magnesium ethoxide dissolved to give a clear solution. The pressure was reduced, and byproduct ethanol was distilled out of the solution. The resulting solution was used in a CVD experiment similar to that of Example 3. A film of magnesium oxide, MgO, was obtained.

EXAMPLE 12

Equal molar quantities of the barium di(mixed beta-diketonates) from Example 3 and the titanium (mixed beta-diketonates) from Example 7 were dissolved in an equal weight of tetraglyme. This mixture was used in a CVD experiment similar to that of Example 3, to deposit a film of barium titanate, $BaTiO_3$.

COMPARATIVE EXAMPLE 13

Example 12 was repeated with titanium(IV) isopropoxide, a conventional source for CVD of titanium oxide, in place of the titanium (mixed beta-diketonates) from Example 7. A solid precipitate (probably a polymeric barium isopropoxide) formed immediately, and the mixture could not be used as a vapor source for CVD.

EXAMPLE 14

Synthesis of pentamethyldiethylenetriamine (pmdeta) adduct of mixed barium beta-diketonates, Ba(beta-diketonates)$_2$·pmdeta. Ba (0.878 g, 6.39 mmol) and pmdeta (2.22 g, 12.8 mmol) were placed together in a flask and 7 mL of THF was added. Bubbles were evolved slowly upon addition of a beta-diketone mixture (2.26 g, 12.8 mmol) diluted with 7 mL of THF. The reaction, more intense after passing $NH_3$ through the solution for 5 minutes, continued for 20 minutes until there was very little metal. The $NH_3$ flow was continued for another 5 minutes followed by 15 minutes of stirring until only flecks of metal remained. On addition of $NH_3$ to the solution the second time, a light green gel, perhaps Ba(beta-diketonate)$_2$(NH$_3$)$_x$, formed but slowly disappeared on stirring under flowing $N_2$. The solution was then filtered through celite and the solvent was removed in vacuo to leave a light yellow liquid (4.16 g, 78%). This liquid was used in a CVD experiment similar to that of Example 3, to deposit a film of barium carbonate, $BaCO_3$.

EXAMPLE 15

Example 14 was repeated with strontium in place of barium. Similar results were obtained.

EXAMPLE 16

Synthesis of mixed titanyl bis(beta-diketonates), TiO (beta-diketonates)$_2$. A beta-diketone mixture (6.81 g, 38.6 mmol) diluted with 10 mL of THF was cannula-transferred to Ti(O$^i$Pr)$_4$ (5.48 g, 19.3 mmol) diluted with 20 mL of THF. The reaction produced heat and resulted in an amber-colored solution. After complete addition, H$_2$O (0.35 mL, 19.4 mmol) in 10 mL of THF was added dropwise. There was no noticeable color change. The solution was stirred 3 days, filtered and the solvent was removed in vacuo at 25° C. After most of the solvent was removed, the product was further evacuated at 80° C. for 20 minutes leaving a dark brown, viscous liquid (7.65 g, 96%). This liquid was used in a CVD experiment similar to that of Example 3, to deposit a transparent film of titanium dioxide, TiO$_2$.

EXAMPLE 17

The precursors for barium, strontium and titanium made according to Examples 14, 15 and 16 were mixed in the molar ratio 7:3:10 and used in a CVD experiment similar to Example 3, with a substrate temperature 500° C. The resulting barium strontium titanate film contained significant carbon contamination, which was removed by annealing for 10 minutes at 600° C. in flowing oxygen gas.

EXAMPLE 18

Synthesis of mixed beta-diketonates of ruthenium(III), Ru(beta-diketonates)$_3$. RuCl$_3$.H$_2$O (1.81 g, 8.01 mmol) was suspended in 15 mL of EtOH and a beta-diketone mixture (4.23 g, 24.1 mmol) diluted with 7 mL of EtOH was added. Smoke was evolved upon dropwise addition of Et$_3$N (2.45 g, 24.2 mmol) diluted with 15 mL of EtOH. The solution was refluxed at 98° C. for 26 hours, the solvent was removed in vacuo and 30 mL of hexane was added. After filtration, the solvent was removed leaving a very dark red/brown, viscous liquid (4.07 g, 81.4%). This liquid was taken up in 3.20 g of mesitylene giving a 56% w/w solution. This solution did not show any appreciable change on exposure to air.

CVD was carried out with this solution as in Example 1. A film of metallic ruthenium(IV) dioxide, RuO$_2$, was produced with electrical resistivity about 1.4×10$^{-4}$ ohm-cm. In the absence of oxygen, a similar deposition produced a film with composition RuO$_{0.5}$.

EXAMPLE 19

Synthesis of mixed yttrium tris(beta-diketonates), Y(beta-diketonates)$_3$. A beta-diketone mixture (16.85 g, 96.0 mmol) was diluted in 30 mL of EtOH and added to YCl$_3$ (5.01 g, 25.7 mmol) dissolved in 75 mL of EtOH. Some smoke was evolved upon dropwise addition of Et$_3$N (7.80 g, 77.1 mmol) diluted with 15 mL of EtOH and the solution eventually became yellow and cloudy. After stirring for hours, the EtOH was removed in vacuo at ambient temperature to leave white solid suspended in a yellow oil.

To this was added 60 mL of hexane. After filtration, removal of the solvent in vacuo and further evacuation at 90° C. to remove excess beta-diketone, a viscous yellow liquid (1.19 g, 71%) remained. This liquid was used in a CVD experiment similar to that of Example 1, to deposit a film of yttrium(III) oxide, Y$_2$O$_3$, along with some excess oxygen or hydroxide and no detectable carbon.

EXAMPLE 20

Synthesis of mixed beta-diketonates of lanthanum, La(beta-diketonates)$_3$. A beta-diketone mixture (13.51 g, 77.0 mmol) was diluted in 30 mL of EtOH and added to LaCl$_3$ (5.00 g, 20.4 mmol) dissolved in 100 mL of EtOH. Some smoke was evolved upon dropwise addition of Et$_3$N (6.19 g, 61.2 mmol) diluted with 20 mL of EtOH and the solution eventually became yellow. After stirring 12 hours, the EtOH was removed in vacuo at ambient temperature to leave white solid suspended in a yellow oil. To this was added 50 mL of hexane. After filtration, removal of the solvent in vacuo and further evacuation at 90° C. to remove excess beta-diketone, a very viscous yellow liquid (8.22 g, 61%) remained. This liquid was dissolved in 12.58 g of pmdeta to give a 40% w/w solution. This solution was used in a CVD experiment similar to that of Example 1, to deposit a film of lanthanum oxide containing some carbon impurity.

EXAMPLE 21

Synthesis of mixed beta-diketonates of manganese(III), Mn(beta-diketonates)$_3$.

Manganese tris(acetylacetonate), Mn(acac)$_3$, (1.01 g, 2.87 mmol) and a beta-diketone mixture (1.87 g, 10.7 mmol) were added together to a flask neat. The flask was fitted with a reflux condenser and the very dark brown mixture was heated to 130° C. when a colorless liquid (acacH) began to reflux. After heating for 1.5 hours, the acacH and excess beta-diketones were removed in vacuo at 130° C. leaving a dark brown liquid which became a glassy solid (1.19 g, 72%) on cooling. The solid was dissolved in 1.90 g of pmdeta to give a 39% w/w solution.

The resulting solution was used in a CVD experiment similar to that of Example 3. A film of manganese(III) oxide, Mn$_2$O$_3$, was produced.

EXAMPLE 22

Synthesis of the tetramethylethylenediamine adduct of magnesium bis(beta-diketonate), Mg(beta-diketonate)$_2$.tmeda. To magnesium ethoxide, Mg(OEt)$_2$, (5.00 g, 43.7 mmol) was added 125 mL dimethoxyethane (DME) and a beta-diketone mixture (16.86 g, 96.1 mmol). After refluxing 12 h at 90° C., the volatile material and excess beta-diketones were removed in vacuo at 90° C. leaving a yellow glassy solid. This was dissolved in 20 g of tmeda, heated gently and then the volatiles were removed at ambient temperature giving a slightly-viscous yellow liquid (16.2 g, 75% yield).

The resulting solution was used in a CVD experiment similar to that of Example 3. A film of magnesium oxide, MgO, was produced.

EXAMPLE 23

Synthesis of mixed lead beta-diketonates, Pb(beta-diketonates)$_2$. Lead(II) acetylacetonate, Pb(acac)$_2$, (2.00 g, 4.94 mmol) and a beta-diketone mixture (1.74 g, 9.87 mmol) were added together to a flask neat to form a suspension of white solid in a yellow liquid. The suspension became a clear solution upon refluxing for 12 hours at 180° C. After heating another 12 hours, the excess acacH was removed in vacuo at 90° C. leaving a dark brown glass. This product was dissolved in pmdeta. The resulting solution was used in a CVD experiment similar to that of Example 3. A film of lead oxide was produced.

EXAMPLE 24

Synthesis of mixed vanadyl bis(beta-diketonates), V(beta-diketonates)$_2$. Vanadyl trichloride, VOCl$_3$, (0.92 g, 5.31 mmol) was cooled to 0° C. and 20 mL of EtOH was added dropwise giving an orange solution. Addition of a beta-diketone mixture (3.57 g, 20.3 mmol) diluted in 10 mL of EtOH gave a deep chocolate-brown solution. Addition of the first drops of Et$_3$N (1.77 g, 17.5 mmol) produced white smoke, and the solution began to turn red upon further addition. After complete addition and subsequent removal of the ice bath, the solution was deep red. The solution was stirred at ambient temperature for 12 hours and then the volatiles were removed in vacuo. Hexane (90 mL) was added, the solution was filtered and the volatiles were removed in vacuo. Further evacuation at 90° C. removed some excess beta-diketones and resulted in color change from deep red to black to blue to finally give an olive-colored glass (2.68 g, 133%). This solid was dissolved in 4.42 g of pmdeta giving a 38% w/w solution. The resulting solution was used in a CVD experiment similar to that of Example 3. A film of carbon-containing vanadium oxide was deposited.

EXAMPLE 25

Synthesis of nickel bis(beta-diketonate mixture), Ni(beta-diketonates)$_2$. A beta-diketone mixture (5.97 g, 34.0 mmol) was diluted in 10 mL of EtOH and added to NiCl$_2$ (2.00 g, 15.4 mmol) which was suspended in 30 mL of EtOH giving an orange solution with orange solid. Some smoke was evolved upon dropwise addition of Et$_3$N (3.14 g, 31.1 mmol) diluted with 10 mL of EtOH and the solution eventually became yellow-green. After stirring 12 hours, the solution had turned bright green. The EtOH was removed in vacuo at ambient temperature and 50 mL of hexane was added. After filtration, removal of the solvent in vacuo and further evacuation at 90° C. to remove excess beta-diketones, a green glassy material (4.73 g, 75%) remained. This was dissolved in 6.9 g of pmdeta to give a 41% w/w solution. The resulting solution was used in a CVD experiment similar to that of Example 3. A film of nickel oxide was produced.

EXAMPLE 26

Synthesis of the pentamethyldiethylenetriamine adduct of calcium bis(beta-diketonate mixture), Ca(beta-diketonates)$_2$.pmdeta. CaH$_2$ (2.01 g, 47.8 mmol) was suspended in pmdeta (17.30 g, 99.8 mmol) diluted with 10 mL of THF, and a beta-diketone mixture (17.51 g. 99.8 mmol) diluted with 20 mL of THF was added. No bubbling occurred during addition, so the reaction was heated to reflux. Slow gas evolution was observable while heating, so the solution was refluxed 2 days until the solution no longer bubbled. The grey suspension was filtered and the solvent was removed in vacuo at 25° C. leaving a light yellow liquid (12.93 g, 48%). The resulting solution was used in a CVD experiment similar to that of Example 3. A film of calcium carbonate, CaCO$_3$, was produced.

EXAMPLE 27

Synthesis of cerium tetrakis(beta-diketonate mixture), Ce(beta-diketonates)$_4$.

For the following reaction, all manipulations before solvent removal were performed on a benchtop in air. Ce(NO$_3$)$_3$.6H$_2$O (4.99 g, 16.1 mmol) was dissolved in 15 mL of MeOH and a beta-diketone mixture (8.08 g, 4.61 mmol) diluted with 25 mL of MeOH was added. 4 M NaOH was added slowly to the solution until the pH was 9, giving a dark red oil with no precipitate. The solution was extracted with 70 mL of hexane, and all of the colored material was taken up into the hexane layer. The hexane layer was removed using a separatory funnel and the solvent was removed in vacuo leaving an oily, solid material (9.70 g, 63%). This was dissolved in mesitylene, and the resulting solution was used in a CVD experiment similar to that of Example 1. A film of cerium(rv) oxide, CeO$_2$, was produced.

EXAMPLE 28

Synthesis of niobium(V) mixed beta-diketonates. Niobium(v) ethoxide, Nb(OEt)$_5$ (3.99 g, 12.5 mmol), and a beta-diketone mixture (11.09 g, 63.2 mmol) were added together to a flask neat. This was warmed to 50° C. under a static partial vacuum until EtOH began to reflux and the solution color began to darken. When the color became a darker red, the volatiles were removed under dynamic vacuum until bubbling was no longer evident. This gave a deep-red liquid (12.26 g). Some ethoxide ligands remained, so the actual number of beta-diketone ligands is not known. The liquid was used in a CVD experiment similar to that of Example 3. A film of carbon-containing niobium oxide was deposited.

EXAMPLE 29

Synthesis of molybdenum mixed beta-diketonates, Mo(beta-diketonate)$_5$. Dropwise addition of 20 mL of EtOH to MoCl$_5$ (1.50 g, 5.49 mmol) produced some smoke and heat. A beta-diketone mixture (4.83 g, 2.75 mmol) diluted in 20 mL of EtOH was added to this suspension. Addition of Et$_3$N (2.80 g, 2.77 mmol) produced much more smoke and a dark-brown solution. After stirring 5 hours, the volatiles were removed in vacuo and 60 mL of hexane was added. The solution was filtered and the volatiles were removed in vacuo leaving a very viscous, dark-brown liquid (2.96 g, 55%). This product was diluted with mesitylene, and the resulting solution was used in a CVD experiment similar to that of Example 3. A film of molybdenum oxide was formed.

EXAMPLE 30

Synthesis of mixed copper(II) beta-diketonates, Cu(beta-diketonates)$_2$. For the following reaction, all manipulations before solvent removal were performed on a benchtop in air. Copper(II) acetate, Cu(OAc)$_2$.H$_2$O, was dissolved in 75 mL of boiling water and passed through a filter into a stirring solution of 20 mL of a beta-diketone mixture in 20 mL of MeOH. After stirring 5 minutes, a dark-blue hydrophobic mass had formed. This was extracted with 40 mL of hexane and separated from the colorless aqueous layer with a separatory funnel. Removal of the solvent in vacuo left a dark-blue solid with light-blue solid present. The solid was dissolved in 20 mL of hexane and filtered to remove some of the Cu(OAc)$_2$.H$_2$O impurity present. Removal of the solvent left a dark-blue solid (15.06 g) still showing evidence of Cu(OAc)$_2$.$_2$O impurity. The solid was dissolved in a minimal amount of decane and filtered again leaving behind a fairly large amount of light blue solid (Cu (OAc)$_2$.H$_2$O). The solvent was removed from the solution in vacuo leaving a very dark blue solid (7.74 g, 47%). This copper beta-diketonate mixture was highly soluble in organic solvents. For example, a diglyme solution with concentration of 1.6 mole/liter was prepared. This solubility is 17 times larger than the solubility of a commonly used precursor, copper(thd)$_2$ (Hthd=2,2,6,6-tetramethylheptanedione).

A mesitylene solution of the copper beta-diketonate mixture was used for CVD of copper oxide films in an experiment similar to that of Example 1. The stoichiometry of the films depended on the oxygen content of the deposition atmosphere, varying from Cu$_2$O with no oxygen to CuO for 20% oxygen.

EXAMPLE 31

Synthesis of mixed indium beta-diketonates, In(beta-diketonates)$_3$. InC$_3$ (2.50 g, 11.3 mmol) was dissolved in 40 mL of EtOH and a beta-diketone mixture (6.03 g, 34.4 mmol) diluted with 10 mL of EtOH was added. Smoke was evolved upon dropwise addition of Et$_3$N (3.50 g, 34.5 mmol) and the solution turned yellow upon further addition. The solution was stirred for 3 hours and the solvent was then removed in vacuo. After adding 40 mL of hexane, the solution was filtered and the solvent was removed in vacuo leaving a yellow liquid (4.89 g, 67%). The resulting liquid was used in a CVD experiment similar to that of Example 1. An electrically conductive film of indium(III) oxide, In$_2$O$_3$, was deposited.

EXAMPLE 32

Synthesis of mixed dimethyltin(IV) beta-diketonates, Me$_2$Sn(beta-diketonates)$_2$. Me$_2$SnCl$_2$ (10.50 g, 47.8 mmol) was dissolved in 30 mL of EtOH and a beta-diketone mixture (10.62 g, 60.2 mmol) diluted with 15 mL of EtOH was added. Smoke was evolved upon dropwise addition of Et$_3$N (6.12 g, 60.5 mmol) diluted with 15 mL of EtOH and the solution eventually became cloudy. After the addition was complete, the resulting solution was warmed to 95° C. and the precipitate dissolved. A reflux was continued for 12 hours and then the solution was cooled to 25° C. and the solvent was removed in vacuo. After most of the volatiles were removed, evacuation was continued at 60° C. for 4 hours. Hexane (60 mL) was then added, the solution was filtered and the solvent was removed in vacuo giving a turbid, yellow liquid. This viscous liquid was filtered through densely packed celite giving a clear, yellow liquid (7.16 g, 48%). The resulting liquid was used in a CVD experiment similar to that of Example 1. An electrically conductive film of tin(IV) oxide, SnO$_2$, was produced.

EXAMPLE 33

Synthesis of mixed chromium beta-diketonates, Cr(beta-diketonates)$_3$. For the following reaction, all manipulations before solvent removal were performed on a benchtop in air. CrCl$_3$.H$_2$O (2.66 g, 15.1 mmol) was dissolved in 100 mL of water. To this was added urea (20.04 g, 333.7 mmol) and then a beta-diketone mixture (10.55 g, 60.3 mmol). On heating, a precipitate formed. The mixture was heated for 12 hours at 100° C., filtered and then air-dried at ambient temperature. After drying, 20 mL of benzene was added and this was heated to boiling. Then, 75 mL of hot petroleum ether was added carefully and the resulting solution was chilled in an ice bath. On cooling, no crystals formed so the purple solution was filtered and the solvent was removed in vacuo to leave an oily solid. On standing, the dark brown mass solidified as a dark purple material (3.98 g, 69%). This solid was dissolved in mesitylene and the resulting solution was used in a CVD experiment similar to that of Example 1. A film of chromium(III) oxide, Cr$_2$O$_3$, was formed.

EXAMPLE 34

Synthesis of the triethylenetetramine adduct of mixed strontium beta-diketonates, Sr(beta-diketonates)$_2$.teta. SrH$_2$ (4.64 g, 51.8 mmol) was suspended in 30 mL of THF and triethylenetetamine (7.57 g, 51.8 mmol) was added. The suspension was cooled in an ice bath and a beta-diketone mixture (18.24 g, 104.2 mmol) diluted with 30 mL of THF was added dropwise. After the addition was complete, the ice bath was removed and after stirring 2 hours at room temperature the mixture began to heat up and bubble rapidly. Bubbling had subsided after 1 hour, and stirring was continued another 12 hours. The turbid solution was then filtered through celite and the solvent was removed in vacuo to leave a light yellow, viscous liquid (21.16 g, 70%) which was taken up in pmdeta (19.38 g) to give a 52% w/w solution. The resulting solution was used in a CVD experiment similar to that of Example 3. A film of strontium carbonate, SrCO$_3$, was formed.

EXAMPLE 35

Synthesis of mixed beta-diketonates of iron(III), Fe(beta-diketonates)$_3$. Iron(III) tris(acetylacetonate), Fe(acac)$_3$, (1.10 g, 3.11 mmol) and a beta-diketone mixture (2.46 g, 14.0 mmol) were placed together in a flask and heated to 115° C. The dark rust-colored solution eventually became darker as it was refluxed for 12 hours. The volatiles were then removed in vacuo to leave a very dark brown liquid (1.56 g, 86%). This liquid was used in a CVD experiment similar to that of Example 3. A film of iron(III) oxide, Fe$_2$O$_3$, was formed.

EXAMPLE 36

Synthesis of mixed beta-diketonates of cobalt(III), Co(beta-diketonates)$_3$. Cobalt(l) carbonate, CoCO$_3$, (0.50 g, 4.20 mmol) and a beta-diketone mixture (4.44 g, 25.3 mmol) were placed together in a flask and heated to 100° C. With vigorous stirring, 10% H$_2$O$_2$ (6 mL) was added dropwise resulting in gas and smoke evolving from the dark green solution. After the addition was complete, the solution was slowly cooled to room temperature while gas and smoke were still being generated. After the bubbling had ceased, two 30 mL portions of hexane were used to extract the solution. The volatiles were removed from the resulting solution in vacuo giving a dark forest green solid (2.06 g, 84%). This solid was dissolved in pentamethyldiethylenetriamine, and the resulting solution was used in a CVD experiment similar to that of Example 1. A film of cobalt(III) oxide was formed.

EXAMPLE 37

Synthesis of mixed beta-diketonates of bismuth. Bismuth chloride was first reacted with lithium bis(trimethylsilyl) amide to form bismuth tris(bis(trimethylsilyl)amide), which was then further reacted with mixed beta-diketones.

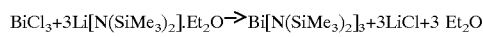

BiCl$_3$+3Li[N(SiMe$_3$)$_2$].Et$_2$O→Bi[N(SiMe$_3$)$_2$]$_3$+3LiCl+3 Et$_2$O 4.569 g BiCl$_3$ was dissolved (suspended) in 25 ml THF, and 10.497 g Li[N(SiMe$_3$)$_2$].Et$_2$O dissolved in 50 ml THF was cannula transferred to the BiCl$_3$ at 25° C. The reaction was exothermic, so a 10° C. water bath was added and addition was continued. The solution became yellow with a colorless precipitate. This was stirred 4 hours at 25° C. with the flask covered with aluminum foil to keep out light from this potentially light-sensitive material. The solvent was stripped off leaving a yellow powder. 75 ml hexane was added, giving a turbid yellow solution, from which a gray precipitate (LiCl) settled out leaving an orange solution. Filtering and stripping left an orange to light yellow solid which was stored overnight under N$_2$ with the flask covered by foil. 8.45 g of a fine, powdery yellow solid Bi[N(SiMe$_3$)$_2$]$_3$ was isolated (85% yield). NMR showed one resonance for the product, plus another resonance with about the same chemical shift (5–10% intensity) for an unknown species. Some THF was also found (~5–10%).

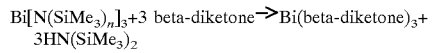

Bi[N(SiMe$_3$)$_n$]$_3$+3 beta-diketone→Bi(beta-diketone)$_3$+ 3HN(SiMe$_3$)$_2$ 2.73 g Bi[N(SiMe$_3$)$_2$]$_3$ was dissolved in 20 ml hexane and 2.19 g of a beta-diketone mixture in 20 ml hexane was added. This gave a very thick yellow gel. The solvent was removed and 20 ml THF was added, giving a light yellow solution. Since there was no obvious color change to indicate complete reaction, the solution was refluxed for 3 hours (80° C.). There was still no color change, so the solvent was removed leaving a yellow gel and some solid material. This eventually dried (on further pumping) to a light yellow powder. 2.71 g of light yellow powder (90% yield) was isolated. The solid was dissolved in 30 ml toluene and filtered through celite. A colorless, very gelatinous solid, probably Li(beta-diketonate), was filtered off leaving a yellow, clear solution. This stripped to a slightly sticky, yellow powder (2.26 g). This is an overall yield of 75%. NMR showed a pure product with all the beta-diketone components.

This product was dissolved in pmdeta and the resulting solution used in a CVD experiment similar to that of Example 3. A film of bismuth oxide was produced. This bismuth precursor can be dissolved in the strontium precursor of Example 15 and the tantalum precursor of Example 9 to form a liquid precursor for the CVD of strontium bismuth tantalate. Many other liquid precursors to multicomponent oxides can be formed by mixing appropriate precursors made according to this invention.

EXAMPLE 38

Example 1 describes one method for the synthesis of beta-diketones. A disadvantage of that method is that the crude product contains impurities (greater than 10 percent) that may need to be removed by methods such as distillation. Another reaction has been found to yield fewer impurities. It uses sodium amide (sodamide) in place of the sodium hydride of example 1, and an organic acid chloride in place of the ethyl ester of Example 1.

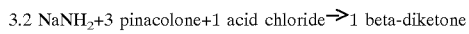

3.2 NaNH$_2$+3 pinacolone+1 acid chloride→1 beta-diketone

The reactants were prepared as follows: Pinacolone is either purged with nitrogen or degassed using the freeze-pump-thaw method to remove dissolved gases such as O$_2$ or CO$_2$. Fresh sodamide (commercial material of 95% purity) is powdered using either a mortar and pestle or a ball mill in an atmosphere of dry nitrogen. (Caution: Old or discolored sodamide can explode when ground or heated.).

$^t$Bu/$^s$Bu beta-diketone was synthesized as follows: Powdered NaNH$_2$ (33.872 g, 868 mmol, 3.2 eq.) was suspended in 350 mL distilled tetrahydrofuran (THF) and heated to 60° C. Neat pinacolone (102 mL, 816 mmol, 3 eq.) was added at 4.4 mL/min with a syringe pump, causing vigorous gas evolution and solvent "reflux". Halfway through the addition, the solution appeared to be more clear but then became more turbid by the end of addition. After complete addition, the suspended material was colorless and the solution was light yellow. The suspension was stirred at 60° C. for 30 minutes and then evacuated (not full vacuum) for 5 minutes at 60° C. to remove some NH$_3$. (This step aids in the filtration process.) The suspension was cooled to 25° C. and filtered through dry celite. After filtration, the volatiles were removed in vacuo leaving the bulk of the material as a soft mass of light yellow solid (probably a weakly-coordinated THF adduct) and a colorless powder coating the walls of the flask. These solids were dissolved in 350 mL of dry, freshly distilled Et$_2$O and cooled to 0° C. Neat 2-methylbutyryl chloride (33 mL, 271 mmol, 1 eq.) was added at 3 mL/min using a syringe pump with vigorous stirring, giving a turbid orange solution. After addition, the cold bath was removed and the reaction was stirred another 10 minutes. The reaction was then quickly poured into a rapidly-stirring mixture of conc. HCl (45 mL, 540 mmol, 2 eq.), 100 g ice and 100 mL water. The layers were separated and the aqueous layer was washed twice with 50 mL Et$_2$O. The Et$_2$O extracts were combined and were then washed twice with 50 mL of sodium bicarbonate solution and then dried over MgSO$_4$. The suspension was filtered (coarse frit) and the volatiles were removed in vacuo leaving a yellow liquid (43.85 g, 88% crude yield, less than 5% impurities by NMR). During distillation at 19 mbar pressure, a 5 mL forerun was collected from 84–88° C. and the product was collected from 88–92° C. (31.831 g, 64% purified yield).

The liquids and solutions disclosed in these examples all appeared to be non-pyrophoric by the methods published by the United States Department of Transportation. One test calls for placing about 5 milliliters of the liquid or solution on an non-flammable porous solid, and observing that no spontaneous combustion occurs. Another test involves dropping 0.5 milliliters of the liquid or solution on a Whatman No. 3 filter paper, and observing that no flame or charring of the paper occurs.

Some of the precursors appear to be non-reactive to atmospheric oxygen and water vapor; these air-stable precursors include those for aluminum (Example 1), ruthenium (Example 18), cerium (Example 27), copper (Example 30), indium (Example 31), chromium (Example 33), iron (Example 35) and cobalt (Example 36). The other precursors generally react with ambient air, and should be stored under a dry inert, atmosphere such as nitrogen.

Those skilled in the art will recognize or be able to ascertain using no more than routine experimentation, many equivalents to the specific embodiments of the invention described specifically herein. Such equivalents are intended to be encompassed in the scope of the following claims.

What is claimed is:

1. A composition for use in the formation of metal oxides, comprising:
   a mixture of metal beta-diketonates, said metal beta-diketonates containing at least one metal and at least two different beta-diketonates, in which at least one of the metal beta-diketonates contains at least two different beta-diketonate ligands bound to the metal.

2. The composition of claim 1, in which the composition of matter is a liquid at 20° C.

3. The composition of claim 1, in which the composition of matter is highly soluble in organic solvents.

4. The composition of matter as in claim 1, 2 or 3 in which the beta-diketonate ligands are chosen from those listed in Table 1 of the specification.

5. The composition of claim 1, 2 or 3 in which the metal or metals are selected from the group consisting of zinc, cadmium, mercury, aluminum, gallium, indium, thallium, tin, lead, antimony, bismuth, lithium, sodium, potassium, rubidium, cesium, beryllium, magnesium, calcium, strontium, barium, scandium, yttrium, lanthanum, titanium, zirconium, hafnium, vanadium, niobium, tantalum, chromium, molybdenum, tungsten, manganese, technetium, rhenium, iron, ruthenium, osmium, cobalt, rhodium, iridium, nickel, palladium, platinum, copper, silver, cerium, the other rare earth metals and the actinide metals.

6. The composition of claim 5 in which the metal or metals are selected from the group consisting of barium, strontium, calcium, magnesium, aluminum, titanium, zirconium, vanadium, niobium, tantalum, chromium, molybdenum, manganese, iron, ruthenium, cobalt, nickel, copper, zinc, indium, tie, lead, bismuth, yttrium, lanthanum and cerium.

7. The composition of claim 1, wherein the beta-diketonate has the formula, $R^1C(=O)CHR^3C(=O)R^2$, where $R^1$ and $R^2$ may be an alkyl group, a fluoroalkyl group or an alkyl group containing oxygen- or nitrogen-containing species (for example, an amino, alcohol or alkoxyl species); and $R^3$ may be an alkyl group, a fluoroalkyl group or an alkyl group containing oxygen- or nitrogen-containing species or H.

8. The composition of claim 7, wherein the alkyl group of $R^1$, $R^2$ or $R^3$ contains less than ten carbons.

9. The composition of claim 7, wherein the alkyl group of $R^1$, $R^2$ or $R^3$ contains less than seven carbons.

10. The composition of claim 1, wherein the mixture comprises at least four different beta-diketonate ligands.

11. The composition of claim 1, wherein the mixture comprises at least six different beta-diketonate ligands.

12. A compound for use in the formation of metal oxides, comprising:
   a metal beta-diketonate containing at least two different beta-diketonate ligands bound to the metal.

13. The composition of claim 12, in which the composition of matter is a liquid at 20° C.

14. The composition of claim 12, in which the composition of matter is highly soluble in organic solvents.

15. The composition of claim 12, 13 or 14 in which the beta-diketonate ligands are chosen from those listed in Table 1 of the specification.

16. The composition of claim 12, wherein the beta-diketonate has the formula, $R^1C(=O)CHR^3C(=O)R^2$, where $R^1$ and $R^2$ may be an alkyl group, a fluoroalkyl group or an alkyl group containing oxygen- or nitrogen-containing species (for example, an amino, alcohol or alkoxyl species); and $R^3$ may be an alkyl group, a fluoroalkyl group or an alkyl group containing oxygen- or nitrogen-containing species or H.

17. The composition of claim 16, wherein the alkyl group of $R_1$, $R^2$ or $R^3$ contains less than ten carbons.

18. The composition of claim 16, wherein the alkyl group of $R^1$, $R^2$ or $R^3$ contains less than seven carbons.

19. The compound of claim 12, wherein the metal is selected from the group consisting of zinc, cadmium, mercury, aluminum, gallium, indium, thallium, tin, lead, antimony, bismuth, lithium, sodium, potassium, rubidium, cesium, beryllium, magnesium, calcium, strontium, barium, scandium, yttrium, lanthanum, titanium, zirconium, hafnium, vanadium, niobium, tantalum, chromium, molybdenum, tungsten, manganese, technetium, rhenium, iron, ruthenium, osmium, cobalt, rhodium, iridium, nickel, palladium, platinum, copper, silver, cerium, rare earth metals and actinide metals.

20. The compound of claim 12, wherein the metal is selected from the group consisting of barium, strontium, calcium, magnesium, aluminum, titanium, zirconium, vanadium, niobium, tantalum, chromium, molybdenum, manganese, iron, ruthenium, cobalt, nickel, copper, zinc, indium, tin, lead, bismuth, yttrium, lanthanum, and cerium.

21. A process for forming a metal-containing film, comprising:
   providing a mixture of metal beta-diketonates, said metal beta-diketonates containing at least one metal and at least two different beta-diketonates, in which at least one of the metal beta-diketonates contains at least two different beta-diketonate ligands bound to the metal, wherein the metals are selected from the group consisting of zinc, cadmium, mercury, aluminum, gallium, indium, thallium, tin, lead, antimony, bismuth, lithium, sodium, potassium, rubidium, cesium, beryllium, magnesium, calcium, strontium, barium, scandium, yttrium, lanthanum, titanium, zirconium, hafnium, vanadium, niobium, tantalum, chromium, molybdenum, tungsten, manganese, technetium, rhenium, iron, ruthenium, osmium, cobalt, rhodium, iridium, nickel, palladium, platinum, copper, silver, cerium, rare earth metals and actinide metals; and
   contacting the mixture to a surface in a deposition process to deposit a metal-containing material.

22. The process of claim 21, wherein the metals are selected from the group consisting of barium, strontium, calcium, magnesium, aluminum, titanium, zirconium, vanadium, niobium, tantalum, chromium, molybdenum, manganese, iron, ruthenium, cobalt, nickel, copper, zinc, indium, tin, lead, bismuth, yttrium, lanthanum, and cerium.

23. The process of claim 21, wherein the mixture comprises at least four different beta-diketone ligands.

24. The process of claim 21, wherein the mixture comprises at least six different beta-diketone ligands.

25. The process of claim 21, wherein the deposited material comprises one or more metal oxides.

26. The process of claim 21, wherein a sol-gel process is used to deposit material containing one or more metals or metal oxides.

27. The process of claim 21, wherein a spray-coating or spin-coating process is used to deposit material containing one or more metals or metal oxides.

* * * * *

UNITED STATES PATENT AND TRADEMARK OFFICE
CERTIFICATE OF CORRECTION

PATENT NO. : 6,258,157 B1
DATED : July 10, 2001
INVENTOR(S) : Roy Gordon

It is certified that error appears in the above-identified patent and that said Letters Patent is hereby corrected as shown below:

Column 20, claim 6,
Line 66, delete "tie" and insert therefor -- tin --.

Signed and Sealed this

Eleventh Day of December, 2001

Attest:

*Attesting Officer*

NICHOLAS P. GODICI
*Acting Director of the United States Patent and Trademark Office*